United States Patent
Mauder et al.

(10) Patent No.: US 9,825,129 B2
(45) Date of Patent: Nov. 21, 2017

(54) TRANSISTOR DEVICE

(71) Applicant: Infineon Technologies Austria AG, Villach (AT)

(72) Inventors: Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/280,734

(22) Filed: Sep. 29, 2016

(65) Prior Publication Data

US 2017/0092716 A1 Mar. 30, 2017

(30) Foreign Application Priority Data

Sep. 30, 2015 (DE) .......... 10 2015 116 611

(51) Int. Cl.
*H01L 29/06* (2006.01)
*H01L 29/10* (2006.01)
*H01L 29/78* (2006.01)
*H01L 29/08* (2006.01)

(52) U.S. Cl.
CPC ...... *H01L 29/0634* (2013.01); *H01L 29/0865* (2013.01); *H01L 29/0882* (2013.01); *H01L 29/1095* (2013.01); *H01L 29/7816* (2013.01); *H01L 29/7831* (2013.01)

(58) Field of Classification Search
CPC .................................................. H01L 29/0634
See application file for complete search history.

(56) References Cited

U.S. PATENT DOCUMENTS

| | | | |
|---|---|---|---|
| 6,566,709 B2 | 5/2003 | Fujihira | |
| 6,835,993 B2 | 12/2004 | Sridevan et al. | |
| 8,575,695 B2 | 11/2013 | Bobde et al. | |
| 8,841,186 B2* | 9/2014 | Hoelke | H01L 21/26586 257/330 |
| 2014/0151758 A1* | 6/2014 | Meiser | H01L 29/66666 257/288 |

FOREIGN PATENT DOCUMENTS

DE 102013113286 A1 6/2014

* cited by examiner

*Primary Examiner* — Yu-Hsi D Sun
(74) *Attorney, Agent, or Firm* — Murphy, Bilak & Homiller, PLLC

(57) ABSTRACT

A transistor device includes: a first source region and a first drain region spaced apart from each other in a first direction of a semiconductor body; at least two gate regions arranged between the first source region and the first drain region and spaced apart from each other in a second direction of the semiconductor body; at least one drift region adjoining the first source region and electrically coupled to the first drain region; at least one compensation region adjoining the at least one drift region and the at least two gate regions; a MOSFET including a drain node connected to the first source region, a source node connected to the at least two gate region, and a gate node. Active regions of the MOSFET are integrated in the semiconductor body in a device region that is spaced apart from the at least two gate regions.

25 Claims, 9 Drawing Sheets

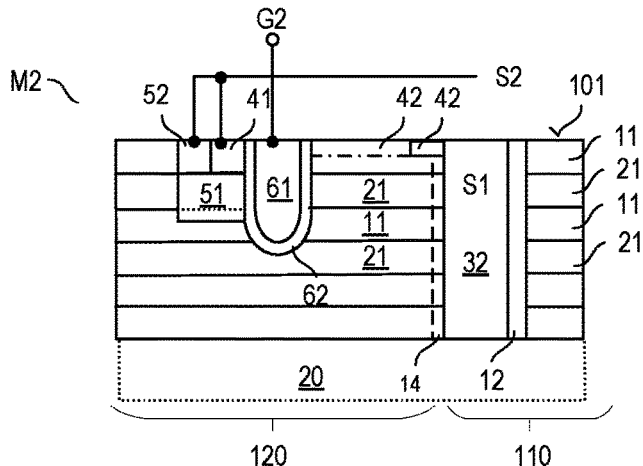
FIG 14
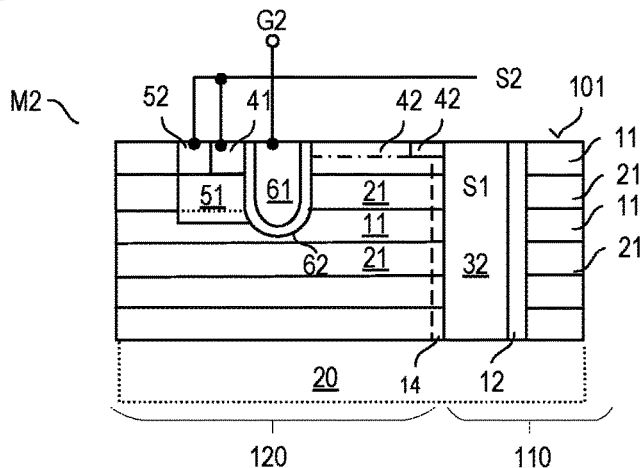
FIG 15
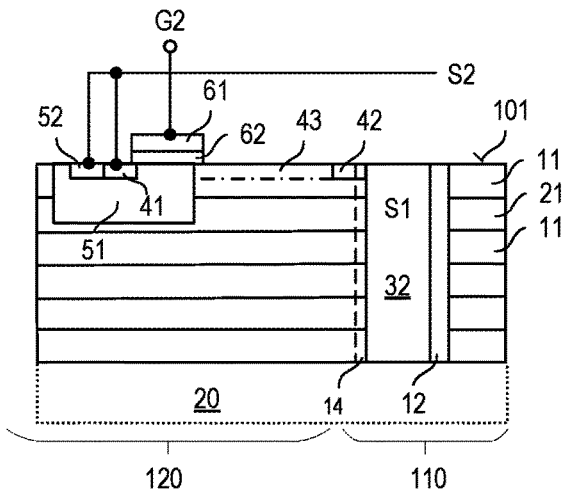 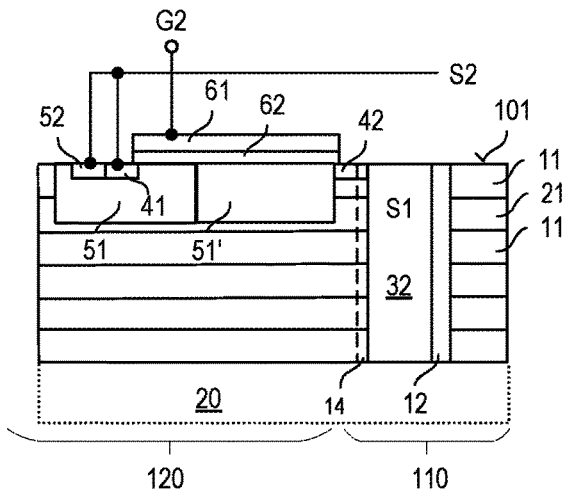
FIG 16A  FIG 16B

TRANSISTOR DEVICE

TECHNICAL FIELD

This disclosure in general relates to a transistor device, in particular a lateral superjunction transistor device.

BACKGROUND

A superjunction transistor device includes at least one drift region of a first doping type (conductivity type) and a compensation region of a second doping type (conductivity type) complementary to the first doping type. The drift region and the compensation region are connected such that in an on-state (switched on state) of the transistor device a current can flow in the drift region, while in the off-state (switched off state) a depletion region expands in the drift region and the compensation region that prevents a current flow through the drift region.

There is a need to provide a superjunction transistor device with a low on-resistance and a high voltage blocking capability.

SUMMARY

One example relates to a transistor device. The transistor device includes a first source region and a first drain region spaced apart from each other in a first direction of a semiconductor body. At least two gate regions are arranged between the first source region and the first drain region and spaced apart from each other in a second direction of the semiconductor body. At least one drift region adjoins the first source region and is electrically coupled to the first drain region. At least one compensation region adjoins the at least one drift region and the at least two gate regions. The transistor device furthermore includes a MOSFET including a drain node connected to the first source region, a source node connected to the at least two gate region, and a gate node. Active regions of the MOSFET are integrated in the semiconductor body in a device region that is spaced apart from the at least two gate regions.

Another example relates to a lateral transistor device. The transistor device includes at least two first sources regions and a first drain region, wherein the at least two first source regions are spaced apart from the first drain region in a first lateral direction of a semiconductor body and from each other in a second lateral direction of the semiconductor body. At least two gate regions are arranged between the at least two first source regions and the first drain region and spaced apart from each other in the second lateral direction. At least one drift region adjoins the at least two first source regions and the at least two gate regions and is electrically coupled to the first drain region. At least one compensation region adjoins the at least one drift region and the at least two gate regions. The transistor device furthermore includes a MOSFET including a drain node connected to the first source region, a source node connected to the at least two gate regions, and a gate node. Active regions of the MOSFET are integrated in the semiconductor body in a device region that is spaced apart from the at least two gate regions.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 14-15 show vertical cross sectional views of the MOSFET according to different examples;

FIGS. 16A-16B show vertical cross sectional views of the MOSFET according to different examples;

DETAILED DESCRIPTION

Figure 1A:
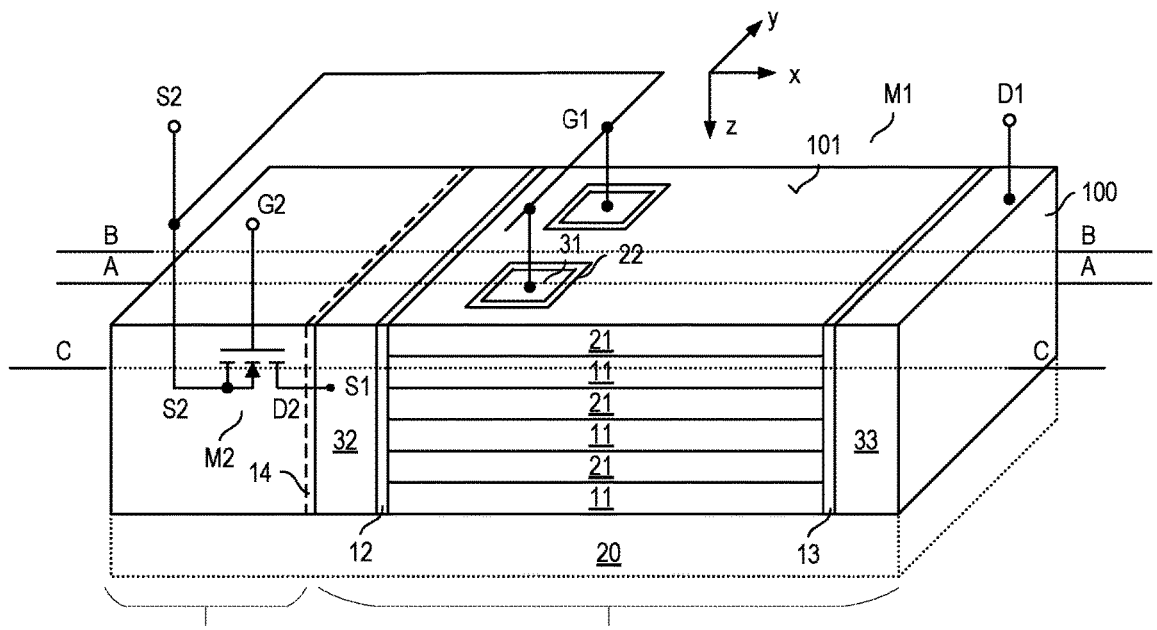
FIGS. 1A-1E schematically illustrate a perspective sectional view (FIG. 1A), vertical cross sectional views (FIGS. 1B-1C), and horizontal cross sectional views (FIGS. 1D-1E) of a transistor device including a JFET (Junction Field-Effect Transistor) and a MOSFET (Metal Oxide Semiconductor Field-Effect Transistor) integrated in one semiconductor body.

In the following detailed description, reference is made to the accompanying drawings. The drawings form a part of the description and by way of illustration show specific examples in which the invention may be practiced. It is to he understood that the features of the various examples described herein may be combined with each other, unless specifically noted otherwise.

FIGS. 1A to 1E show a perspective sectional view (FIG. 1A), a first vertical cross sectional view (FIG. 1B), a second vertical cross sectional view (FIG. 1C), and horizontal cross sectional views (FIGS. 1D-1E) of a transistor device according to one example. In particular, FIGS. 1A-1E show a lateral superjunction transistor device. Referring to FIG. 2, which shows an equivalent circuit diagram of the transistor device shown in FIGS. 1A-1E, the transistor device includes a JFET (Junction Field-Effect Transistor) M1 and a MOSFET (Metal Oxide Semiconductor Field-Effect Transistor) M2 integrated in a common semiconductor body 100. This semiconductor body 100 is schematically illustrated in FIG. 2. The semiconductor body 100 may include a conventional semiconductor material such as silicon (Si), silicon carbide (SiC), gallium nitride (GaN), gallium arsenide (GaAs), or the like. As the transistor device includes two devices, namely the JFET and the MOSFET, it may also be referred to as an integrated circuit.

Referring to FIGS. 1A-1E., the transistor device, in particular the JFET M1 in the transistor device, includes a first source region 12 and a first drain region 13 spaced apart from each other in a first direction of the semiconductor body 100. According to one example, the first direction x is a first lateral direction of the semiconductor body 100. A "lateral direction" of the semiconductor body 100 is a direction parallel to a first surface 101 of the semiconductor body 100. At least two gate regions 22 are arranged in the semiconductor body 100 between the first source region 12 and the first drain region 13 and are spaced apart from each other in a second direction y of the semiconductor body 100. This second direction y is a second lateral direction in the example shown in FIGS. 1A-1D. This second lateral direction y is different from the first lateral direction x. According to one example, the second lateral direction y is substantially perpendicular to the first lateral direction x.

Furthermore, the transistor device includes at least one drift region 11. In particular, the transistor device may include a plurality, that is, two or more drift regions 11. The at least one drift region 11 adjoins the first source region 12 and is electrically coupled to the drain region 13. According to one example, the at least one drift region 11 adjoins the drain region 13 (as shown). At least one compensation region 21 adjoins the at least one drift region 11 and the at least two gate regions 22. As shown in FIGS. 1A-1D, the transistor device may include a plurality of drift regions 11 and compensation regions 21, with these drift regions 11 and compensation regions 21 being arranged alternatingly in a third direction z of the semiconductor body 100. This third direction z is a vertical direction of the semiconductor body in the example shown in FIGS. 1A-1D. The "vertical direction" is a direction perpendicular to the first surface 101 of the semiconductor body 100.

Optionally, the at least one drift region 11 and the at least one compensation region 21 are arranged on a substrate 20. According to one example, this substrate 20 is a semiconductor substrate. According to another example, the substrate includes an electrically insulating material, such as an oxide. According to yet another example, the substrate 20 includes an electrically insulating layer on a semiconductor layer such that the electrically insulating layer adjoins a layer stack with the at least one drift region 11 and the at least one compensation region 21.

In the following, "layer stack" denotes the layer stack with the at least one drift region 11 and the at least one compensation region 21. According to one example, this layer stack, in the first lateral direction x, extends from the first source region 12 to the first drain region 13, and the at least two gate regions 22 extend from the first surface 101 in the vertical direction z into the layer stack.

In the examples shown in FIGS. 1A-1E an uppermost layer in the layer stack is a compensation region 21. This, however, is only an example. It should be noted, that the uppermost layer could also be a drift region 11. The "uppermost layer" in the layer stack is that layer that adjoins the first surface 101.

Furthermore, in examples shown in FIGS. 1A-1E a lowermost layer in the layer stack is a drift region 11. This, however, is only an example. It should be noted, that the lowermost layer could also be a compensation region 21. The "lowermost layer" in the layer stack is that layer that is arranged farthest to the first surface 101 and adjoins the optional substrate 20.

The first source region 12, the first drain region 13 and the at least one drift region 11 have a first doping type (conductivity type), and the at least two gate regions 22 and the at least one compensation region 21 have a second doping type (conductivity type) complementary to the first doping type. The first source region 12, the first drain region 13, the at least one drift region 11, the at least one compensation region 21 and the at least two gate regions 22 are part of the JFET M1 shown in FIG. 2. A type (n-type or p-type) of this JFET is defined by the first doping type. The JFET M1 is an n-type JFET, if the first doping type is an n-type, and up-type JFET, if the first doping type is a p-type.

Referring to FIGS. 1A-1D, the transistor device further includes a first source electrode 32 electrically connected to the first source region 12, a first drain electrode 33 electrically connected to the first drain region 13, and at least two first gate electrodes 31, with each of these at least two first gate electrodes 31 being connected to one of the at least two gate regions 22. In particular, the first source electrode 32 is ohmically connected to the first source region 12, the first drain electrode 33 is ohmically connected to the drain region 13, and each of the at least two first gate electrodes 31 is ohmically connected to the respective gate region 22. In the example shown in FIGS. 1A-1D, the first source electrode 32, the first drain electrode 33 and the at least two first gate electrodes 31 each extend in the vertical direction z into the semiconductor body 100. According to one example, each of these electrodes 31, 32, 33 extends from the first surface 101, which forms an upper end of the layer stack 11, 21, completely through the layer stack 11, 21, that is, to a lower end of the layer stack 11, 21 and/or to the substrate 20, respectively. The first source electrode 32 forms or is connected to a source node S1 of the JFET M1, the drain electrode 33 forms or is connected to a drain node D1 of the JFET M1, and the at least two first gate electrodes 32 form or are connected to a gate node G1 of the JFET M1.

Figure 1B:
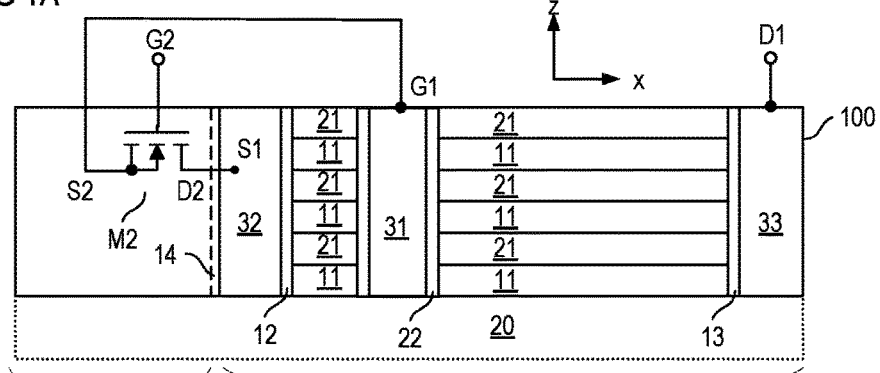
Figure 1C:
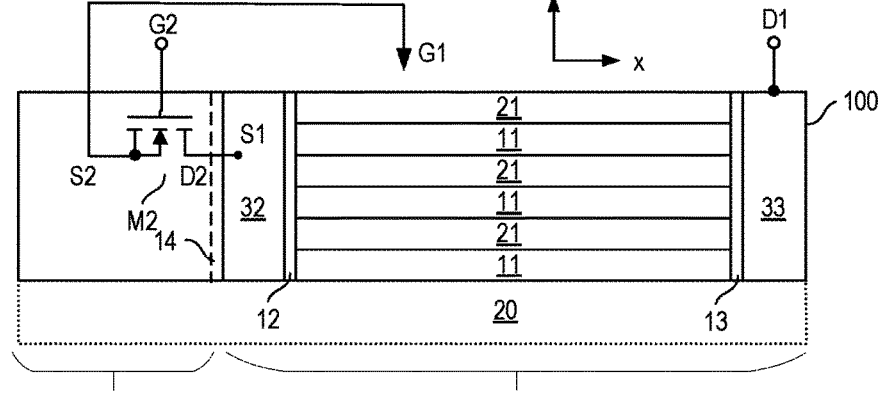
Figure 2:
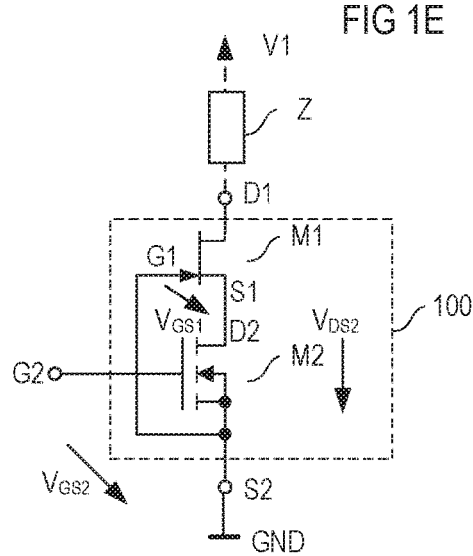
FIG. 2 shows an equivalent circuit diagram of the transistor device shown in FIGS. 1A-1E.

In the examples shown in FIGS. 1A-1C he gate, source and drain electrodes 31, 32, 33, in the vertical direction of the semiconductor body 100, extend from the first surface 101 to the lowermost layer in the layer stack. This, however, is only an example. According to another example (not shown) at least one of these electrodes, in the vertical direction, is spaced apart from the lowermost layer.

According to one example, the first source region 12, the drain region 13, the at least one drift region 11, the at least one compensation region 21, and the at least two gate regions 22 are monocrystalline semiconductor regions. According to one example, a doping concentration of the first source region 12 is selected from a range of between $1E17$ cm$^{-3}$ and $1E21$ cm$^{-3}$, a doping concentration of the at least one drift region 11 is selected from a range of between $1E13$ cm$^{-3}$ and $1E17$ cm$^{-3}$, and a doping concentration of the at least two gate regions 22 is selected from a range of between $1E17$ cm$^{-3}$ and $1E21$ cm$^{-3}$. The doping concentration of the first drain region 13 can be selected from the same range as the doping concentration of the first source region 12, and the doping concentration of the at least one compensation region 21 can be selected from the same range as the doping concentration of the at least one drift region 11.

The example doping concentrations given above are maximum doping concentrations of the respective semiconductor regions. For example, the source region 12, the gate regions 22, and the drain region 14 can be produced by implanting and/or diffusing dopant atoms from the trenches in which the finished device includes the gate, source and drain electrodes 31, 32, 33, before forming these gate, source and drain electrodes 31, 32, 33. In this case, the doping concentrations within the gate, source and drain regions 22, 12, 13 may vary. For example, these doping concentrations may have a maximum close to the trench and may decrease towards the drift and compensation regions 11, 21.

According to one example, the first source electrode 32, the first drain electrode 33, and the at least two first gate electrodes 31 include an electrically conducting material. Examples of such electrically conducting material include, but are not restricted to, a metal such as copper (Cu), aluminum (Al), titanium (Ti), or tungsten (W), a highly doped polycrystalline semiconductor material such as polysilicon, a metal silicide, such as tungsten silicide or titanium silicide.

Referring to FIGS. 1A-1D, active device regions, the first source electrode 32, the first drain electrode 33, and the at least two first gate electrodes 31 of the JFET M1 are integrated in a first region 110 of the semiconductor body 100. "Active device regions" of the JFET are the first source region 12, the first drain region 13, the at least two gate regions 22, the at least one drift region 11 and the at least one compensation region 21. These active device regions will briefly be referred to as active regions in the following. Active device regions (active regions) of the MOSFET M2 are integrated in a second region 120 of the semiconductor body 100. In FIGS. 1A-1D, only a circuit symbol of the MOSFET M2 is shown. Examples of how the active regions of the MOSFET M2 can be integrated in the second region 120 are explained further below. The second region 120 is spaced apart from the at least two gate regions 22 and the at least two first gate electrodes 32, respectively. In the examples shown in FIGS. 1A-1D, the second region 120 is spaced apart from the gate regions 22 and the first gate electrodes 31, respectively, in the first lateral direction x. As shown, the second region 120 may adjoin the first source electrode 32. Optionally, a contact region 14 (illustrated in dashed lines) is arranged between the second region and the source electrode 32. This contact region may have the same doping type and the same doping concentration as the first source region 12.

Referring to FIG. 1A-1D and 2, a source node S2 of the MOSFET M2 is electrically connected to the gate regions 22, the first gate electrodes 31, and the gate node G1 of the JFET. A drain node D2 of the MOSFET M2 is electrically connected to the first source region 12, the first source electrode 32, and the source node S1 of the JFET M1, respectively. A gate node G2 of the MOSFET M2 is connected to or forms an external node of the transistor device and is configured to receive a drive signal. According to one example, the MOSFET M2 is an enhancement MOSFET (as shown in FIGS. 1A-1D and 2). According to another example (not shown), the MOSFET M2 is a depletion MOSFET. The MOSFET M2 can be an n-type MOSFET (as shown in FIGS. 1A-1D and 2) or a p-type MOSFET. According to one example, the JFET M1 and the MOSFET M2 are transistors of the same type. That is, the JFET M1 is an n-type JFET and the MOSFET M2 is an n-type MOSFET, or the JFET M1 is a p-type JFET and the MOSFET M2 is a p-type MOSFET. Although the transistor device includes two transistors, namely JFET M1 and MOSFET M2, it can be operated like one single transistor. The second gate node G2, the second source node S2 and the first drain node D1 are external nodes that may serve to interconnect the transistor device in an electronic circuit. An operation state (on or off) of this transistor device is defined by an operation state of the MOSFET M2. In particular, the transistor device is a voltage controlled transistor device that switches on or off dependent on a voltage (gate-source voltage) $V_{GS2}$ received between the second gate node G2 and the second source node S2. One way of operation of the transistor device shown in FIGS. 1A-1C is explained below. First, the operation of the transistor device is explained with reference to the equivalent circuit diagram shown in FIG. 2, then operation is explained with reference to FIGS. 1A-1D. Just for the purpose of explanation, it is assumed that the JFET M1 is an n-type JFET and the MOSFET M2 is an n-type enhancement MOSFET. Furthermore, for the purpose of explanation, it is assumed that the transistor device operates as an electronic switch connected in series with a load Z and that the series circuit with the load Z and the transistor device receives a supply voltage V1.

Referring to FIG. 2, the MOSFET M2 is controlled by the gate-source voltage $V_{GS2}$ between the second gate node G2 and the second source node S2. The MOSFET M2 is in the on-state if a voltage level of this gate-source voltage $V_{GS2}$ is above a predefined threshold level $V_{th1}$. That is, the MOSFET M2 is in the on-state, if $V_{GS2}>V_{th2}$, where $V_{th2}>0$. The JFET M1 is controlled by agate-source voltage $V_{GS1}$ between the first gate node G1 and the first source node S1. An n-type JFET, such as the JFET M1 shown in FIG. 2, is in the on-state if a voltage level of the gate-source voltage, such as the gate-source voltage $V_{GS1}$ shown in FIG. 2, is above a predefined negative threshold level $V_{th2}$. That is, the JFET M1 is in the on-state, if $V_{GS1}>V_{th1}$, where $V_{th1}<0$. Because the first gate node G1 of the JFET M1 is connected to the second source node S2 of the MOSFET M2, the gate-source voltage $V_{GS1}$ of the JFET M1 equals the inverted drain-source voltage $V_{DS2}$ of the MOSFET M2, that is, $V_{GS1}=-V_{DS2}$. The drain-source voltage $V_{DS2}$ of the MOSFET M2 is the voltage between the drain node D2 and the source node S2 of the MOSFET M2.

When the MOSFET M2 is in the on-state, a magnitude of the drain-source voltage $V_{DS2}$ is very low, so that the gate-source voltage $V_{GS1}$ of the JFET is between the negative threshold level $V_{th1}$ and zero. Thus, the JFET M1 is also in the on-state. When the MOSFET M2 switches off, the drain-source voltage $V_{DS2}$ increases until the inverted drain-source voltage $-V_{DS2}$ reaches the negative threshold voltage $V_{th1}$, so that the JFET M1 also switches off.

Referring to FIGS. 1A-1D, in the on-state of the JFET M1 and the MOSFET M2, a current can flow from the first drain node D1 via the drain region 13, the at least one drift region 11, the first source region 12, the first source electrode 32 and the drain-source path D2-S2 of the MOSFET M2 to the second source node S2. When the MOSFET M2 switches off, the electrical potential at the first drain node D1 can increase relative to the electrical potential at the second source node S2. This increase of the electrical potential at the first drain node D1 causes an increase of the electrical potential at the first source region 12 and the first source node S1, respectively, while the electrical potential at the gate regions 22 is tied to the electrical potential at the second source node 82. The increase of the electrical potential of the first source region 12 and the at least one drift region 11, respectively, causes pn junctions between the first source region 12 and the at least one compensation region 21 and between the gate regions 22 and the at least one drift region 11 to be reverse biased. Furthermore, a pn junction between the at least one drift region 11 and the at least one compensation region 21 is reverse biased. Reverse biasing those pn junctions causes the at least one drift region 11 to be depleted of charge carriers. The JFET M1 switches off as soon as the drift region 11 between the at least two gate regions 22 and/or between the gate regions 22 and the source region 12 has been completely depleted of charge carriers.

Figure 1D:
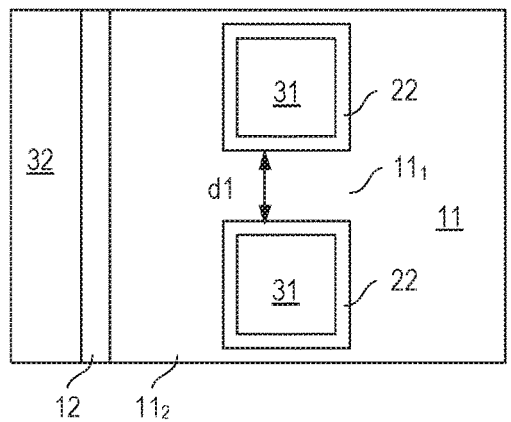
Figure 1E:
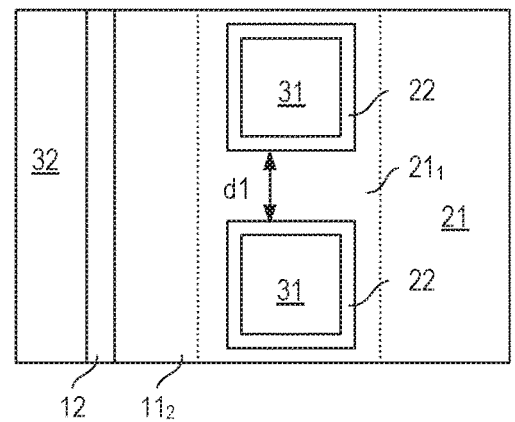

FIG. 1D shows a horizontal cross sectional view of the transistor device in a horizontal section plane C-C going through the at least one drift region 11, and FIG. 1E shows a horizontal cross sectional view of the at least one compensation region 21 adjoining the at least one drift region it, FIGS. 1D and 1E show horizontal cross sectional views of a section that includes the source electrode 32, the source region 12, the gate electrodes 31, and the gate regions 22. FIG. 1D shows those sections of the drift region 11 that need to be depleted in order to switch off the JFET M1. In FIG. 1D, $11_1$ denotes a section of the drift region 11 between the at least two gate regions 22, and $11_2$ denotes a section of the at least one drift region 11 between the gate regions 22 and the first source region 12. The threshold voltage $V_{th1}$ of the JFET M1 is the voltage that needs to be applied between the gate region 22 and the first source region 12 in order to completely deplete at least one of these sections $11_1$, $11_2$. In FIGS. 1D and 1E, d1 denotes a distance between the at least two gate regions 22 in the second direction y.

The magnitude (the level) of the threshold voltage $V_{th1}$ is dependent on several design parameters and can be adjusted by suitably designing these parameters. These design parameters include the (shortest) distance d1 between adjacent gate regions 22, a doping concentration of the drift region 11 in the section $11_1$ between the gate regions 22, and a doping concentration of the at least one compensation region 21 in a section $21_1$ that is located between the gate electrodes 31 and adjoins section $11_1$ of the at least one drift region 11.

According to one example, the at least one drift region 11 in the section $11_1$ between the gate electrodes 31 includes a higher doping concentration than in sections spaced apart from the gate electrodes 31 in the direction of the drain region 13. This higher doped section $11_1$ counteracts an increase in the on-resistance caused by the gate electrodes 31, which reduce the cross section in which a current can flow between the source and drain regions. According to one example, the compensation region 21 at least in parts of the region $21_1$ between the gate electrodes 31 includes a higher doping concentration than in other sections, in particular, those sections spaced apart from the gate electrodes 31 in the direction of the drain region 13. This higher doped section $21_1$ ensures that the at least one drift region in the section between the gate electrodes 31 is depleted of charge carriers, so that the JFET blocks, when the threshold voltage $V_{th1}$ is applied. According to one example, the higher doped region of the at least one compensation region 21 is not only between the gate electrodes 31, but surrounds the gate electrodes in the horizontal plane. Such higher doped region is shown in dotted lines in FIG. 1E.

The MOSFET M2 is designed such that a voltage blocking capability of this MOSFET M2 equals at least a magnitude of the JFET's M1 threshold voltage $V_{th1}$, that is $V_{DS2\_MAX} \geq |V_{th1}|$, where $V_{DS2\_MAX}$ is the voltage blocking capability of the MOSFET M2. The voltage blocking capability of the MOSFET M2 is the maximum voltage, the MOSFET M2 can withstand between the drain node D2 and the source node S2. By integrating the active regions of the MOSFET M2 in the second device region 120 spaced apart from or adjacent the first device region 110 and, therefore, outside the first device region 110, the MOSFET M2 can be designed independently from the design of the JFET M1. In particular, integrating the MOSFET M2 in the second device region 120 makes it possible to design the voltage blocking capability of the MOSFET M2 adapted to the threshold voltage $V_{th1}$ of the JFET M1.

Figure 3:
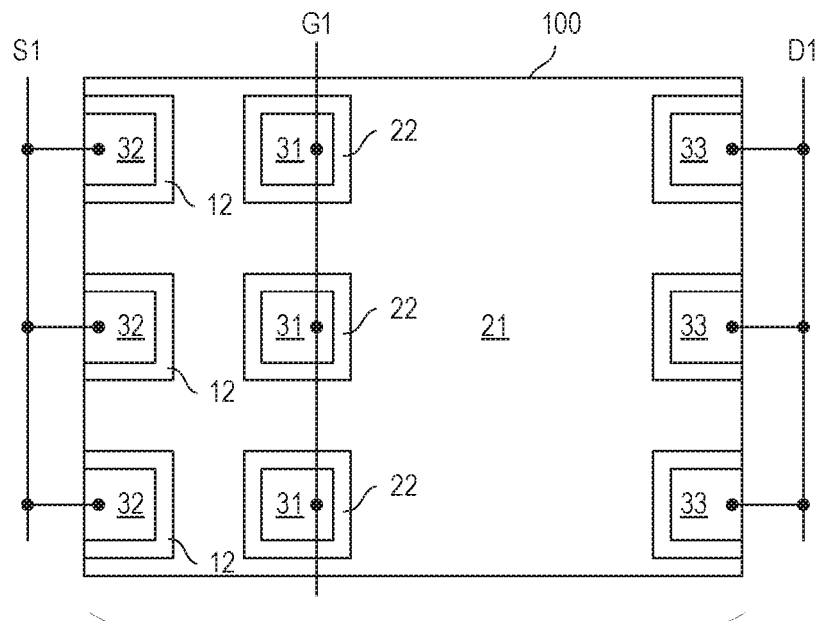
FIG. 3 shows a top view of another example of a transistor device of the type shown in FIGS. 1A-1E.

FIG. 3 shows another example of a transistor device of the type shown in FIGS. 1A-1D. FIG. 3 shows a top view of the first device region 110 in which the JFET M1 is integrated. In the transistor device according to this example, the first source region 12 includes a plurality of doped regions spaced apart from each other in the second lateral direction y. Consequently, the first source electrode 32 includes a plurality of electrode sections with each of these electrode sections being electrically connected (ohmically connected) to one of the doped regions forming the source region 12. The individual electrode sections are connected to the first source node S1, as schematically illustrated in FIG. 3. Furthermore, in the example shown in FIG. 3, the drain region 13 includes a plurality of doped regions spaced apart from each other in the second lateral direction y, and the first drain electrode 33 includes a corresponding number of drain electrode sections. These drain electrode sections are electrically connected to the drain node D1, as schematically illustrated in FIG. 3. It should be noted that implementing both, the first source region 12 and the first drain region 13 with a plurality of doped regions is just an example. A first source region 12 with a plurality of doped regions could be combined with a single first source region 13 as shown in FIGS. 1A-1D, or a first drain region 13 with a plurality of doped regions could be combined with a single source region 12 as shown in FIGS. 1A-1D.

Referring to FIG. 3, the gate regions 22 can be aligned with the doped regions of the source region 12. According to another example, shown in FIG. 4, the gate regions 22 can be located offset relative to the doped regions of the source region 12 in the second lateral direction y.

Figure 4:
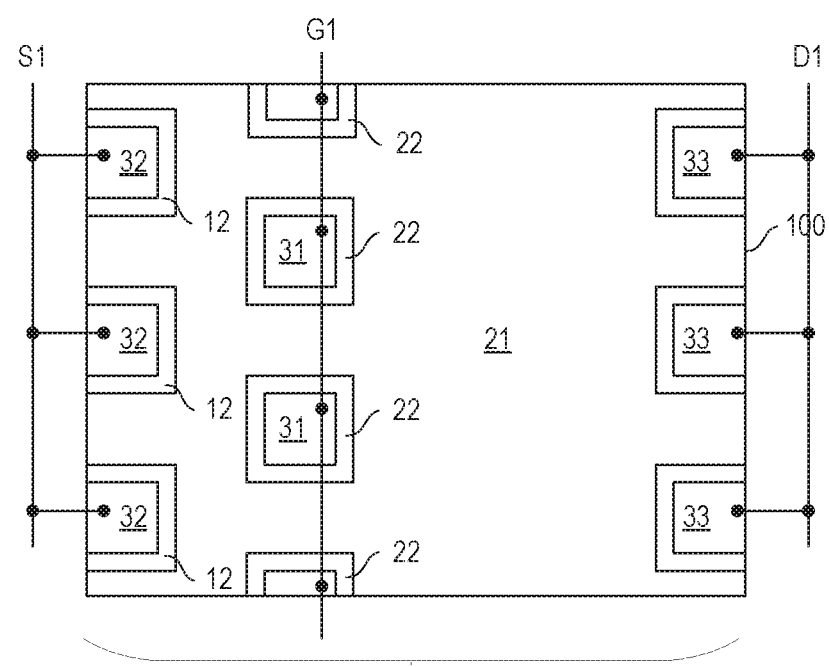
FIG. 4 shows a top view of another example of a transistor device of the type shown in FIGS. 1A-1E.

In FIGS. 3 and 4, the connections of the first source electrode sections to the first source node S1, the connections of the first drain electrode sections to the first drain node D1, and the connection of the first gate electrodes 31 to the first gate node G1 are only schematically illustrated. Furthermore, in FIGS. 1A-1D a connection between the second source node S2 and the first gate node G1 is only schematically illustrated. Implementing these connections may include conventional wiring technologies, such as interconnection (wiring) structures above the first surface 101.

Figure 5:
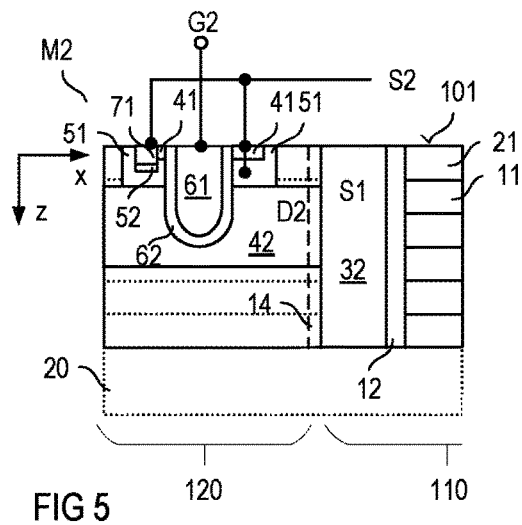
FIGS. 5-8 show vertical cross sectional views of the MOSFET according to different examples.

FIG. 5 shows a vertical cross sectional view of the MOSFET M2 according to one example. According to this example, the MOSFET M2 includes a source region 41, a drain region 42 and a body region 51. The body region 51 separates the source region 41 from the drain region 42. A gate electrode 61 is adjacent the body region 51 and dielectrically insulated from the body region 51 by a gate dielectric 62. In this example, the MOSFET M1 is a vertical MOSFET. That is, the drain region 42 is spaced apart from the source region 41 in the vertical direction z of the semiconductor body 100. The drain region 42 is a buried region that is spaced apart from the first surface 101. In the first lateral direction x, the drain region 42 extends to the first source electrode 32 and is electrically (ohmically) connected to the first source electrode 32 either directly or via the optional contact region 14. Thus, the drain region 42 of the MOSFET M2 forms the drain node D2 of the MOSFET. The gate electrode 61 is arranged in a trench that extends from the first surface 101 into the semiconductor body 100. Referring to FIG. 5, source and body regions 41, 51 can be located on both sides of the gate electrode 61 in order to reduce the on-resistance of the MOSFET M2.

Figure 6:
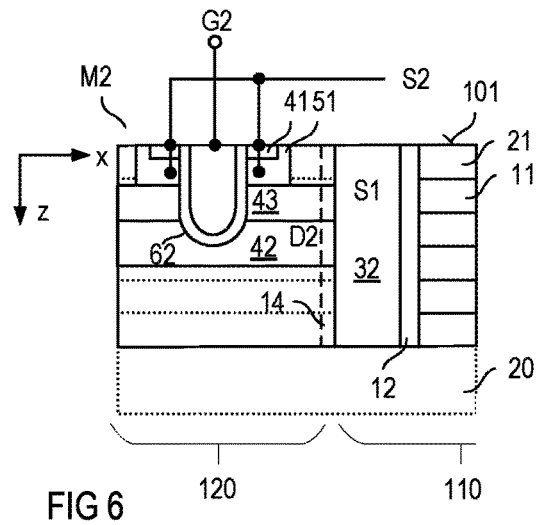

FIG. 6 shows a modification of the MOSFET M2 shown in FIG. 5. The MOSFET M2 shown in FIG. 6 additionally includes a drift region 43 between the body region 51 and the drain region 42. The drift region 43 is of the same doping type (conductivity type) as the drain region 42, but has a lower doping concentration than the drain region 42. By virtue of the drift region 43, the MOSFET M2 shown in FIG. 6 has a higher voltage blocking capability than the MOSFET shown in FIG. 5.

In the MOSFET M2 shown in FIGS. 5 and 6, as well as in other examples of the MOSFET M2 explained below, the source region 41, the drain region 42 and the optional drift region 43 have the same doping type. This doping type is an n-type in an n-type MOSFET and a p-type in a p-type MOSFET. The body region 51 has a doping type complementary to the doping type of the source region 41, the drain region 42 and the optional drift region 43. Each of the MOSFETs shown in FIGS. 5 and 6, as well as the MOSFETs explained herein below, can be implemented as an enhancement MOSFET or as a depletion MOSFET. In an enhancement MOSFET, the body region 51 adjoins the gate dielectric 62 (as shown in FIGS. 5 and 6. In a depletion MOSFET, there is a channel region of the same doping type as the source region 41 and the drain region 42 along the gate dielectric 62 between the gate dielectric 62 and the body region 51. However, such channel region is not shown in FIGS. 5 and 6. A doping concentration of the source region 41 and the drain region 42 can be selected from the same range explained in connection with the first source region 12 above. The doping concentration of the body region 51 may be selected from a range of between 1E16 $cm^{-3}$ and 1E20 $cm^{-3}$. The doping concentration of the drift region 43 may be selected from a range of between 1E15 $cm^{-3}$ and 1E18 $cm^{-3}$. Again, these doping concentrations are maximum concentrations.

In the following, a device structure including one gate electrode 61, one gate dielectric 62, at least one source region 41, at least one body region 51, one drain region 42 and, optionally, at least one drift region 43 will be referred to as transistor cell (MOSFET cell). In FIGS. 5 and 6 one such transistor cell is shown.

Figure 7:
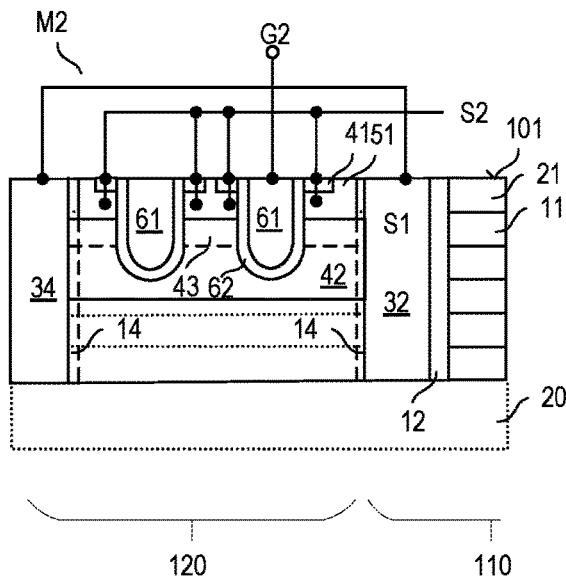

Referring to FIG. 7, the MOSFET M2 may include a plurality of transistor cells. In FIG. 7 two such transistor cells are shown. These transistor cells are connected in parallel by having the source regions 41 connected to the second source node S2, by having the gate electrodes 61 connected to the second gate node G2, and by sharing one drain region 42 connected to the first source electrode 32. Furthermore, also the body regions 51 are connected to the source node S2, as schematically illustrated in FIGS. 5-7. Optionally, the drain region 42 is not only connected to the first source electrode 32, but is further connected to another trench electrode 34 that is spaced apart from the first source electrode 32. This further trench electrode 34 is electrically connected to the source electrode 32, wherein such electrical connection is only schematically illustrated in FIG. 7. Optionally, a doped region 43 of the same doping type as the source region 12 surrounds the further trench electrode 34 within the semiconductor body 100. Equivalently, the first source region 12 may surround the first source electrode 32 within the semiconductor body 100.

The source node S2 of the MOSFET M2 is electrically connected to body region 51. FIG. 5 shows one example of how the source node S2 can be connected to the body region 51. In this example, a further source electrode 71, which is connected to the source node S2, extends from the first surface 101 into the body region 51. The source electrode 71 is connected to the source region 41 at at least one sidewall of the source electrode 71 and to the body region 51 at a bottom of the source electrode 71. According to one example, the body region 51, in a region where the source electrode extends into the body region 51, includes a contact region 52 of the same doping type as the body region 51 and more highly doped than the body region 52. Through this contact region 52 the body region 51 can be connected to the source node S2 via the source electrode 71.

In the example shown in FIG. 5, the source electrode 71 adjoins the source region only on one sidewall of the source electrode 71 and the contact region 52 only at the bottom. This, however, is only an example. According to another example (not shown), the contact region 52 adjoins the source electrode 71 additionally or only at a sidewall opposite the sidewall of the source region 41.

Figure 8:
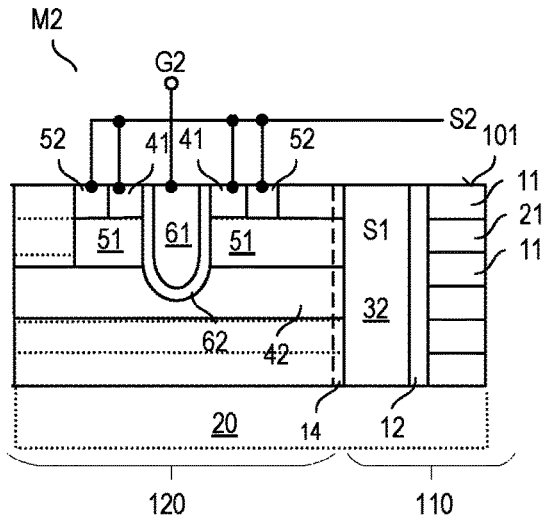

Further connections between the source node S2 and the body and source regions 41, 52 are only schematically illustrated in FIG. 5 and in FIGS. 6-8. Those connections can be implemented as shown in the left part of FIG. 5, or can be implemented with a contact region that adjoins the first surface 101 so that it can be contacted at the first surface 101.

Figure 9:
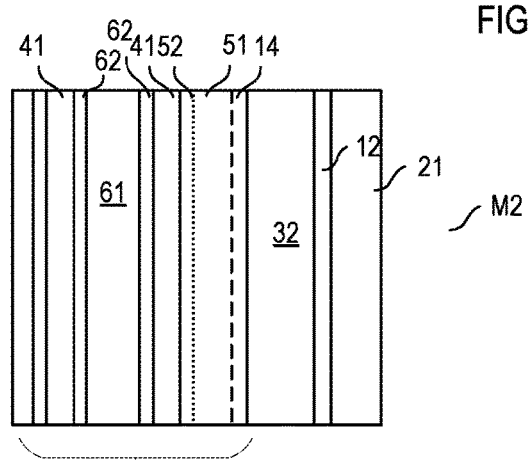
FIG. 9 shows a top view of the MOSFETs shown in FIGS. 5, 6 and 8 according to one example.

FIG. 9 shows a horizontal cross sectional view of one example of MOSFET M2 having such a contact region 52 at the first surface for connecting the body region 51 to the source node S2. The device structure shown in FIG. 9 is based on the device structure shown in FIG. 5. A body contact region 52 adjoining the surface 101, however, may be implemented in the device structures shown in FIGS. 6-7 as well.

The transistor cells shown in FIGS. 5-8 can be implemented as elongated transistor cells (stripe cells). This is explained with reference to FIG. 9, which shows a top view of the MOSFETs M2 shown in FIGS. 5, 6 and 8. Referring to FIG. 9, the elongated transistor cell includes an elongated gate electrode 61 and elongated source and body regions 41, 51. The drain region 42 and the optional drift region 43 are also elongated regions. These regions, however, are out of view in the top view shown in FIG. 9. Equivalently, the transistor cells shown in FIG. 7 can be implemented as elongated transistor cells.

Figure 10:
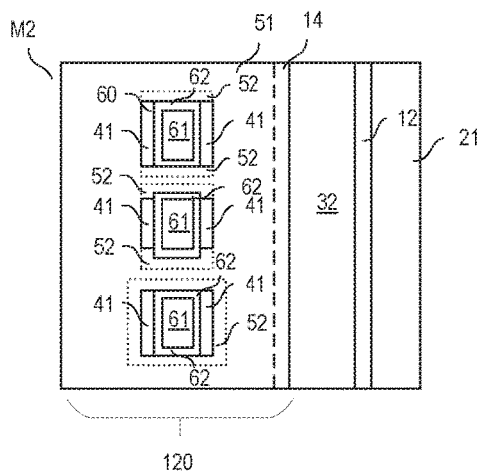
FIGS. 10-12 show top views of MOSFETs of the type shown in FIGS. 5, 6 and 8 according to different examples.
Figure 11:
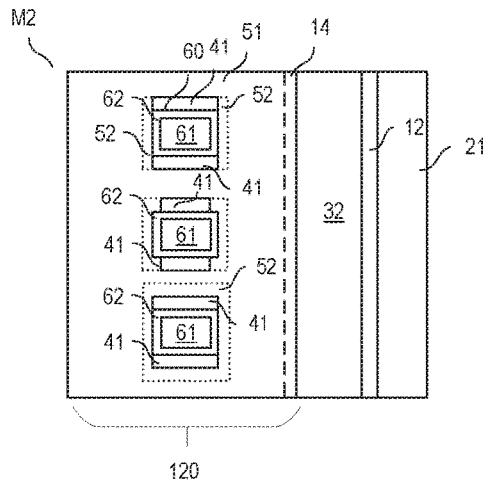
Figure 12:
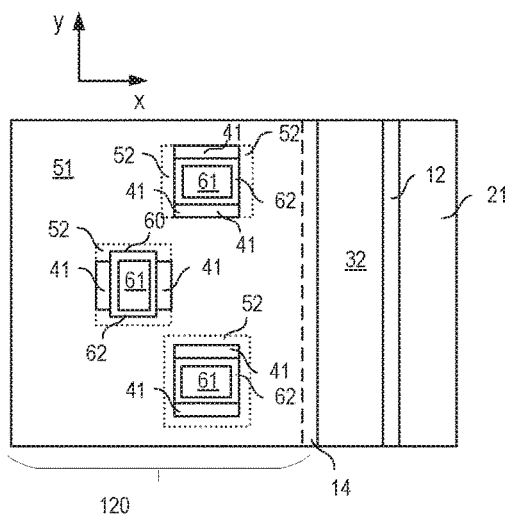

However, implementing the transistor cells as elongated transistor cells is only an example. According to other examples shown in FIGS. 10-12, the MOSFET M2 may include a plurality of transistor cells with each of these transistor cells including a gate electrode 61 and a gate dielectric 62 dielectrically insulating the gate electrode 61 from the body region 51, wherein the gate electrode 61, in the top view, essentially has a rectangular shape or a square shape. In FIGS. 10-12, reference character 60 denotes gate structures of the individual transistor cells. One gate structure 60 includes one gate electrode 61 and one gate dielectric 62. Optionally, the corners of the gate electrodes 61 and/or the gate dielectrics 62 are rounded or beveled. This, however, is not shown in FIGS. 10-12.

In the examples shown in FIGS. 10-12, two source regions 41 are located adjacent the gate structure 60 on opposite sides of the gate structure. The gate structures 60 of the individual transistor cells can be arranged to be substantially in line, as shown in FIGS. 10 and 11. According to another example, shown in FIG. 12, neighboring transistor cells are offset in the first lateral direction x relative to each other. In the examples shown in FIGS. 10-12, each gate structure 60 has four sides. According to one example (as shown) two of these sides are essentially parallel to the source electrode 32, and two of these sides are essentially perpendicular to the source electrode 32. In first type transistor cells, as shown in FIG. 10, the two source regions 41 are arranged along those sides that are parallel to the source electrode 32. In second type transistor cells, as shown in FIG. 11, the two source regions 41 are arranged along those sides that are perpendicular to the source electrode 32. As shown in FIG. 12, one MOSFET M2 may even include first type transistor cells and second type transistor cells. Also the MOSFETs M2 shown in FIGS. 10 and 11 can be modified to include first type transistor cells and second type transistor cells.

According to one example, the source regions 41 are spaced apart from corners of the gate structure 60. This may help to avoid variations in the threshold voltage of the MOSFET. Each of FIGS. 10-12 shows one transistor cell where the source regions 41 are located spaced apart from the corners of the respective gate structure. In case the corners of the gate structures 60 are rounded, the source regions 41 may be located only along straight parts of one gate electrode structure 60, that is, spaced apart from the corner roundings.

Each of FIGS. 10-12, in dotted lines, shows different examples of how the contact regions 52 can be implemented. According to one example, the contact region 52 in a ring-like fashion completely surrounds the gate structure 60 and the source region 41 adjoining the gate structure 60. According to another example, the contact region 52 adjoins the gate structure 60 in those regions where the source region 41 is omitted.

Figure 13A:
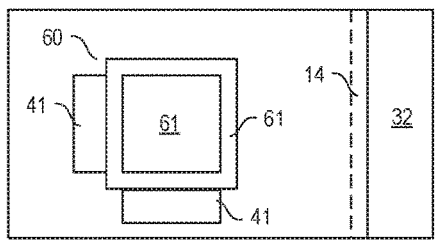
FIGS. 13A-13C show top views of device cells of the MOSFET according to different examples.
Figure 13B:
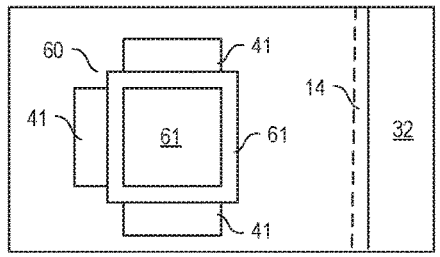
Figure 13C:
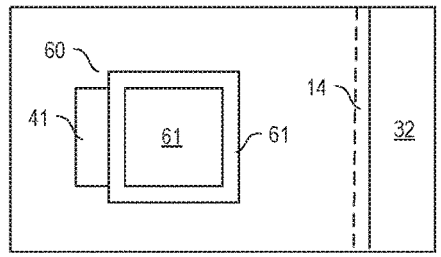

In the examples shown in FIGS. 10-12 each device cell includes two source regions 41 on opposite sides of the gate structure. This, however, is only an example. Other types of device cells are shown in FIGS. 13A-13C. Each of FIGS. 13A-13C shows a top view of one device cell. Each of these device cells can be used in a MOSFET M2 of the type shown in FIGS. 10 and 11 where the device cells (transistor cells) are essentially in line, and a MOSFET M2 of the type shown in FIG. 12 with offset device cells. One MOSFET M2 may include only one type of device cell, or may include two or more types of device cells.

Referring to FIG. 13A, a third type of device cell includes two source regions 41 on adjacent sides of the gate structure. The two source regions 41 may be spaced apart from the corners (as shown), or may extend to the corners and adjoin each other (not shown). In the MOSFET M2, the third type device cell can be positioned relative to the source electrode 31 such that one of the source regions 41 is located along that side of the gate structure parallel to the source electrode 32 that faces away from the source electrode 32 (as shown in FIG. 13A), or such that one of the source regions 41 is located along that side of the gate structure parallel to the source electrode 32 that faces the source electrode 32 (not shown).

Referring to FIG. 13B, a fourth type of device cell includes three source regions 41. These source regions 41 may be spaced apart from the corners shown), or may extend to the corners and adjoin each other (not shown). In the fourth type device cell there is one side of the gate structure where the source regions are omitted. In the MOSFET M2, the fourth type device cell may be positioned relative to the source electrode 31 such that this side faces the source electrode (as shown in FIG. 13A), or such that this side faces away from the source electrode 31 (not shown).

Referring to FIG. 13C, a fifth type of device cell includes only one source region along one side of the gate structure 60. This source region 41 may be spaced apart from the corners as shown), or may extend to the corners. In the MOSFET M2, the fifth type device cell may be positioned relative to the source electrode 31 such that the source region 41 faces the source electrode (as shown in FIG. 13C), or such that the source electrode 41 faces away from the source electrode 31 (not shown).

Body contact regions are not shown in FIGS. 13A-13C. These body contact regions may be implemented as explained with reference to FIGS. 10-12. That is, a body contact region may completely surround the gate structure of one device cells, or may adjoin the gate structure only in those regions where the source region(s) is/are omitted.

The device cells shown in FIGS. 10-13C are referred to as needle cells in the following, as the gate structure 60 of these device cells in a needle-like fashion, in the second device region 120, extends into the semiconductor body. Although the gate structures of these needle cells are drawn to have an essentially rectangular or square shape in the horizontal plane, this is only an example. These gate structures may be implemented as well with any other shape such as a polygonal shape, an elliptical shape, or a circular shape, to name only a view. The source region of one device cell may completely surround the gate structure of the respective device cell, or may partially surround the gate structure.

In the needle cells, the channel width of one device cell is given by the overall length of the respective source region(s) along the gate structure. The overall channel width of the MOSFET M2 is given by the sum of the channel widths of the plurality of device cells. The on-resistance of the MOSFET M2 is the lower the larger the overall channel width is. Furthermore, the switching speed can be varied by varying the overall channel width. In a MOSFET M2 with a plurality of needle cells, the overall channel widths can be varied over a wide range, from a rather small channel width by implementing a low number of transistor cells and/or implementing a source region 41 extending along only a section of the gate structure 60 of one device cell to a rather large channel width by implementing a large number of transistor cells and/or implementing a source region 41 extending completely around the gate structure 60 of one device cell.

Furthermore, the needle cells and the stripe cells can be implemented such that the source region 41 is omitted on that side of the gate structure 60 that faces the source electrode 32. For example, this is shown in FIGS. 11, 12 (in some device cells), and 13A-13C. In the stripe cell shown in FIG. 8, the source region located between the gate electrode 61 and the source electrode 32 can be omitted. By this, the robustness of the MOSFET M2 against latch-up can be increased.

FIGS. 14-15 and 16A-16B show vertical cross sectional views of the MOSFET M2 according to further examples. The MOSFET M2 shown in each of these FIGS. 14-15 and 16A-16B 16 is a lateral MOSFET. That is, the source region 41 and the drain region 42 are spaced apart from each other in the first direction x of the semiconductor body 100. In the examples shown in FIGS. 14 and 15, the gate electrode 61 is arranged in a trench and in the examples shown in FIGS. 16A and 16B, the gate electrode 61 is arranged above the first surface 101 and dielectrically insulated from the body region 51 by the gate dielectric 62, which is also arranged above the first surface 101. Optionally, a drift region 43 is arranged between the drain region 42 and the channel region. The "channel" region is a semiconductor region in which the gate electrode 61 can control a conducting channel by field-effect. In the examples shown in FIGS. 16A-16B, the body region 51 is the channel region.

In the MOSFETs 2 shown in FIGS. 14-15 and 16A-16B, according to one example, the semiconductor body 100 includes a layer stack with complementary doped semiconductor regions 11, 21 not only in the first device region 110, but also in the second device region 120. The body region 51, the source region 41 and the optional contact region 52 can be formed by implanting and/or diffusing dopant atoms into this layer stack. An uppermost layer of this layer may have the same doping type and doping concentration as a layer forming a part of the drift region in the first device region 110. In this case, the drain region 42 may be formed in this uppermost layer 11, as shown in FIGS. 14-15 and 16A-16B.

In the examples shown in FIGS. 14 and 15, the trench with the gate electrode 61 separates the body region 51 from the drain region 42 and the drift region 43, respectively. In these examples, in the on-state of the MOSFET M2, there is conducting channel along the gate dielectric 62. This conducting channel extends from the source region 41 through the body region 51 and through those layers of the layer stack adjoining the gate dielectric 62 to the drain region 42 and the drift region 43, respectively. In these examples, the channel region is formed by those regions in which the conducting channel is formed by field-effect. In the on-state of the MOSFET M2, the conducting channel along the gate dielectric 62 is an inversion channel in the body region 51 and in those layers of the layer stack having the same doping type as the body region 51, and is an accumulation channel in those layers of the layer stack having a doping type complementary to the doping type of the body region 51. Optionally, those layers of the layer stack that adjoin the gate dielectric 62 and have the same doping type as the body region 51 are electrically connected to the body region 51 and the second source node 82, respectively. Such optional connections, however, are not shown in FIGS. 14 and 15.

For example, the MOSFETs M2 shown in FIGS. 14 and 15 are implemented such that the source region 41 has the same doping type as layers 11 in the layer stack and the body region 51 has the same doping type as layers 12 in the layer stack. In this case, in the on-state, a current flows from the source region 41 through the body region 51, the conducting channel along the gate dielectric 62, and through each of the layers 11 adjoining the gate dielectric 62 to the source electrode 32. A drain region 42 can be provided in only one of the layers 11 adjoining the gate dielectric 62 (as shown) or in each of these layers. A voltage blocking capability of these MOSFETs can be adjusted by adjusting the distance between gate dielectric 62 and the at least one drain region 42, wherein the voltage blocking capability increases as the distance increases. The layers 11 of the layer stack act as drift regions in these MOSFETs M2. According to one example (illustrated in dashed and dotted lines) the drain region 42 extends to the gate dielectric 62. In those examples that include the optional contact region 14, the drain region 42 can be formed by a section of the contact region 14 so that an extra drain region does not have to be formed.

The examples shown in FIGS. 14 and 15 are different from each other in how deep the trench with the gate electrode 61 extends into the layer stack. For example, the gate-drain capacitance of the MOSFET M2 can be adjusted by the trench depth, wherein the gate-drain capacitance increases as the trench depth increases, that is, as the number of layers 11 adjoining the gate dielectric 62 increases. Increasing the gate-drain capacitance may help to improve the switching behavior of the overall device with the JFET M1 and the MOSFET M2. In both examples shown in FIGS. 14 and 15, the trench is arranged between the source region 41 and the drain region 42.

In the example shown in FIG. 16A, the drain region 42 can be formed in a layer 11 having the same doping type as the drain region 42. In this case, the voltage blocking capability is mainly defined by the doping concentration of this layer 11 and a distance between the body region 51 and the drain region 42. According to another example, the drain region 42 is formed in layer 21 doped complementary to the drain region 42. In this case, the voltage blocking capability can be adjusted by providing adrift region 43 (shown in dashed and dotted lines in FIG. 16A) between the drain region 42 and the body region 51. In the example shown in FIG. 16B, the body region 51 includes an extension 51' of the same doping type as the body region 51 and more lightly doped. This extension 51' adjoins the drain region 42 and forms a pn-junction with the drain region 42. A voltage blocking capability of this device is mainly defined by the doping concentration of the extension 51' and its dimension between the drain region 42 and the body region 51. The gate electrode 61 and the gate dielectric extend along the body region 51 and the extension 51'. The channel length or the gate length may be chosen to be longer than 1 µm, for example.

In the examples shown in FIGS. 14-15 and 16A-16B, like in the examples explained before, the source region 41 and the body region 51 are connected to the second source node S2. Optionally, the MOSFET M2 includes a contact region 52 of the same doping type as the body region 51, but more highly doped than the body region 51. This contact region 52 adjoins the body region 51 and is connected to the second source node S2.

Figure 17:
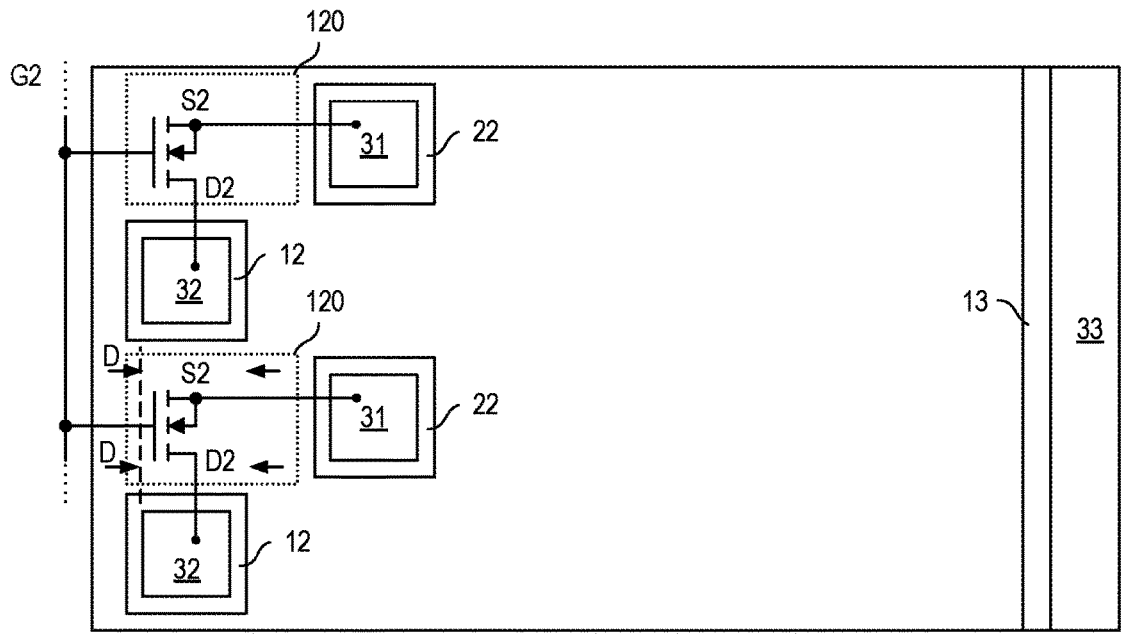
FIG. 17 shows a top view of a transistor device including a JFET and a MOSFET according to another example.

FIG. 17 shows a top view of a transistor device according to another example. In this example, the source region 12 includes a plurality of doped regions that are spaced apart from each other in the second lateral direction y. Furthermore, the device includes a plurality of second device regions 120, with each of these second device regions 120 being arranged between two neighboring sections of the first source region 12. In each of these second device regions 120, at least one MOSFET M2 is integrated. In FIG. 16 only circuit symbols of these MOSFETs M2 are shown. Examples of how these MOSFETs M2 can be integrated are explained with reference to FIGS. 18-20 below. The individual MOSFETs M2 are interconnected with the JFET M1 as explained above.

Figure 18:
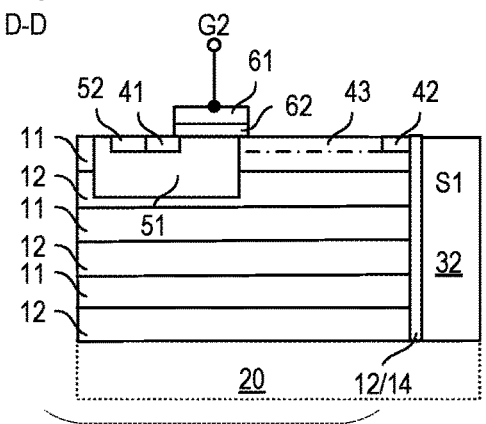
FIGS. 18-20 show vertical cross sectional views of the MOSFET in a transistor device of the type shown in FIG. 17 according to different examples.

FIG. 18 shows a vertical cross sectional view of one second device region 120 in a section plane D-D shown in FIG. 16. The MOSFET shown in FIG. 17 is a lateral MOSFET with a device topology already explained with reference to FIG. 15. The drain region 42 of this MOSFET is connected to one of the source electrode sections adjacent the second device region 120.

Figure 19:
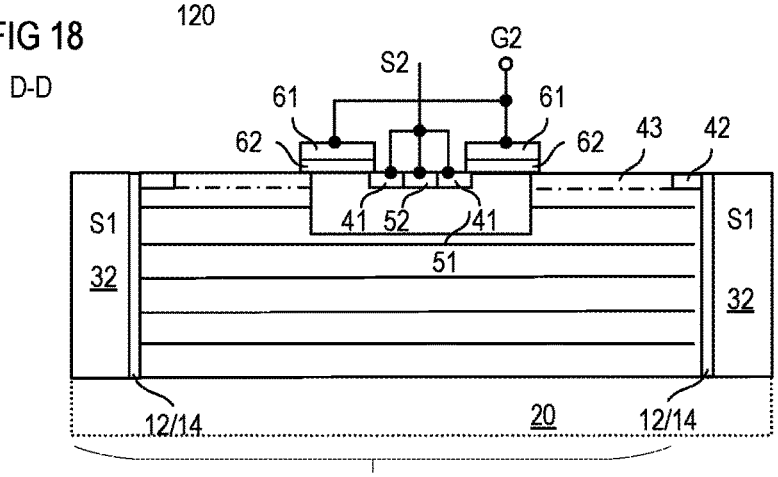

FIG. 19 shows a vertical cross sectional view of the MOSFET M2 according to another example. In this example, the MOSFET M2 includes two transistor cells, wherein a drain region 42 of a first one of these transistor cells is electrically connected to a first one of the source electrode sections adjacent the second device region 120, and wherein a drain region of a second one of the transistor cells is connected to a second one of the source electrode sections adjacent the second device region 120. In a horizontal plane of the semiconductor body, the body region 51 can ring-shaped and surround the source region 41 and the contact region 52.

Figure 20:
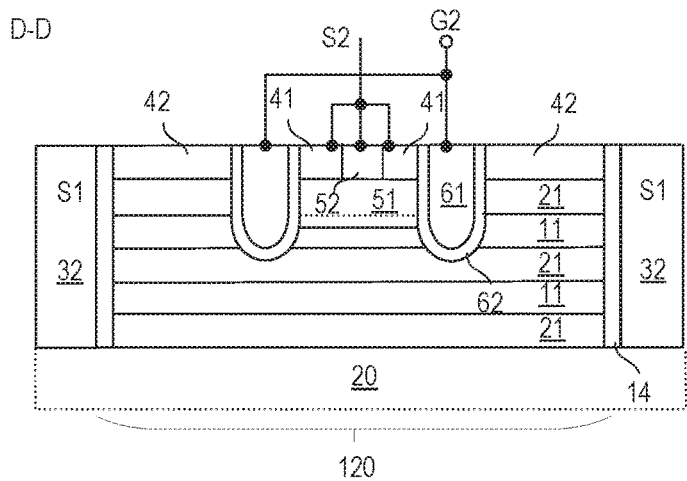

FIG. 20 shows a vertical cross sectional view of a MOSFET M2 according to another example. The MOSFET M2 shown in FIG. 20 is different from the MOSFET M2 shown in FIG. 19 in that the gate electrodes 61 of the two transistors cells are arranged in trenches extending from the first surface 101 into the layer stack. Optionally, those regions of the layer stack that have the same doping type as the body region 51 are electrically connected to the body region 51 or the second source node S2, respectively.

Respective connections, however, are not shown in FIG. 20. In the MOSFET M2 shown in FIG. 20, like in the MOSFET M2 shown in FIGS. 14 and 15, in the on-state there is a conducting channel in each device cell along the gate dielectric 62 in the body region 51, and those layers of the layer stack that adjoin the gate dielectric 62. As shown, the drain regions 42 may adjoin the channel regions, that is, the gate dielectrics 62. According to another example, like in the device shown in FIG. 19, there is a drift region 43 between the channel region and the drain region 42.

Figure 21A:
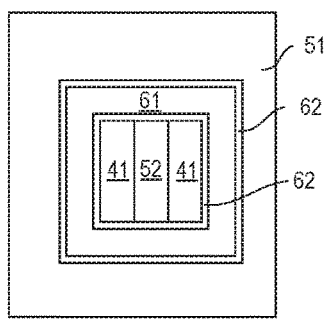
FIGS. 21A-21C show top views of the MOSFET shown in FIG. 20 according to different examples.
Figure 21B:
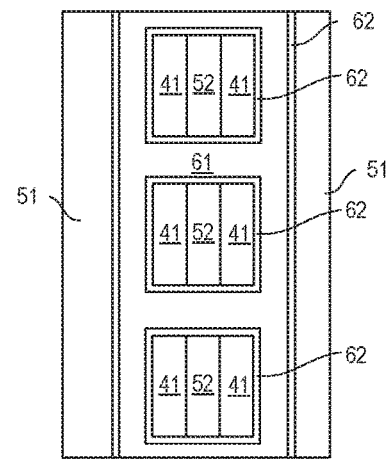
Figure 21C:
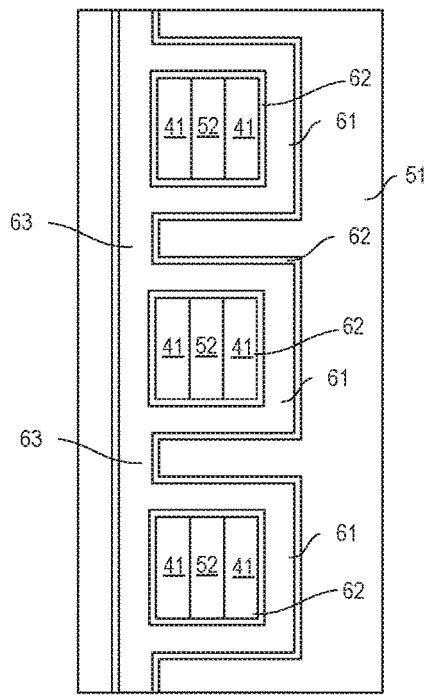

FIGS. 21A-21C show horizontal cross sectional views of different examples of how the transistor cells shown in FIG. 20 may be implemented. According to one example, shown in FIG. 21A, the MOSFET M2 includes at least one ring-like trench electrode which forms the gate electrodes of both device cells and surrounds the source regions 41, the body region 51 (out of view in FIG. 21A), and the contact region 52. In this example, there are two separate source region 41. According to another example (not shown) there is only one (ring-like) source region that is shared by the two device cells.

According to another example, shown in FIG. 21B, the MOSFET M2 includes a grid-shaped gate electrode 61 which defines several spacings, wherein a body region (not shown in FIG. 21B), at least one source region 41, and an optional contact region 52 is arranged in each of these spacings. According to yet another example, shown in FIG. 21C, there are a plurality of structures of the type shown in FIG. 21A, wherein the gate electrodes 61 of these structures are electrically connected by electrode sections 63 that are dielectrically insulated from the semiconductor body 100 by a dielectric. It should be noted that the cell topology shown in FIG. 21B may be used in the type of transistor cell shown in FIG. 7 as well.

Figure 22:
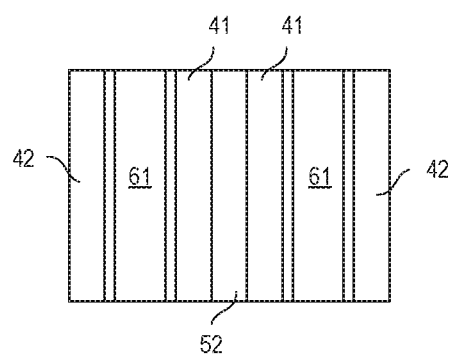
FIG. 22 shows a top view of the MOSFET shown in FIG. 20 according to another example.

The device topologies shown in FIGS. 18-20 and 21A-21C are not restricted to be implemented in connection with a source electrode 31 having several separate source electrode sections, as shown in FIG. 17, but may also be implemented in an integrated circuit with one source electrode 31 in the second device regions 120. In this case, the MOSFET M2 could also be implemented with stripe cells. A top view of those stripe cells is shown in FIG. 22.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device, comprising:
   a first source region and a first drain region spaced apart from each other in a first direction of a semiconductor body;
   at least two gate regions arranged between the first source region and the first drain region and spaced apart from each other in a second direction of the semiconductor body;
   at least one drift region adjoining the first source region and electrically coupled to the first drain region;
   at least one compensation region adjoining the at least one drift region and the at least two gate regions; and
   a MOSFET comprising a drain node connected to the first source region, a source node connected to the at least two gate regions, and a gate node,
   wherein active regions of the MOSFET are integrated in the semiconductor body in a device region that is spaced apart from the at least two gate regions.

2. The transistor device of claim 1, further comprising:
   a plurality of drift regions and a plurality of compensation regions arranged alternatingly in a third direction of the semiconductor body.

3. The transistor device of claim 2, wherein the first direction is a first lateral direction of the semiconductor body, wherein the second direction is a second lateral direction of the semiconductor body, and wherein the third direction is a vertical direction of the semiconductor body.

4. The transistor device of claim 1, wherein the device region is spaced apart from the at least two gate regions in the first direction.

5. The transistor device of claim 1, further comprising:
   a first source electrode connected to the first source region,
   a first drain electrode connected to the first drain region; and
   at least two first gate electrodes each connected to one of the at east two gate regions.

6. The transistor device of claim 5, wherein each of the first source electrode, the first drain electrode, and the at least two first gate electrodes is a trench electrode.

7. The transistor device of claim 6, wherein the first source electrode is arranged between the at least one drift region and the device region.

8. The transistor device of claim 1, further comprising:
   a first source electrode connected to the first source region,
   wherein the first source region includes a plurality of doped regions spaced apart from each other,
   wherein the first source electrode comprises a plurality of source electrode sections, and
   wherein each of the plurality of doped regions is connected to one of the plurality of source electrode sections.

9. The transistor device of claim 1, wherein the first drain region includes a plurality of doped regions spaced apart from each other, and wherein each of the plurality of doped regions is connected to a first drain electrode section.

10. The transistor device of claim 1, wherein the MOSFET comprises a plurality of transistor cells connected in parallel.

11. The transistor device of claim 1, wherein the MOSFET comprises a source region and a drain region spaced apart from each other in a vertical direction o f the semiconductor body.

12. The transistor device of claim 11, further comprising:
   a first source electrode connected to the first source region,
   wherein the drain region of the MOSFET is a buried region and extends to the first source electrode.

13. The transistor device of claim 1, wherein the MOSFET comprises a source region and a drain region spaced apart from each other in a lateral direction of the semiconductor body.

14. The transistor device of claim 1, wherein the MOSFET further comprises:
   a drift region adjoining a body region; and a gate electrode dielectrically insulated from the body region by a gate dielectric.

15. The transistor device of claim 14, wherein the drift region of the MOSFET has a doping type complementary to a doping type of the body region.

16. The transistor device of claim 14, wherein the drift region of the MOSFET has the same doping type as the body region, and wherein the gate electrode is also adjacent the drift region and dielectrically insulated from the drift region by the gate dielectric.

17. The transistor device of claim 1, further comprising:
a layer stack comprising a plurality of drift regions and compensation regions, and a corresponding layer stack in the device region,
wherein a gate electrode of the MOSFET is arranged in a trench extending into at least two layers of the layer stack in the device region.

18. The transistor device of claim 17, wherein the gate electrode extends into three or more layers of the layer stack in the device region.

19. A lateral transistor device, comprising:
at least two first source regions and a first drain region, wherein the at least two first source regions are spaced apart from the first drain region in a first lateral direction of a semiconductor body and from each other in a second lateral direction of the semiconductor body;
at least two gate regions arranged between the at least two first source regions and the first drain region and spaced apart from each other in the second lateral direction;
at least one drift region adjoining the at least two first source regions and the at least two gate regions and electrically coupled to the first drain region;
at least one compensation region adjoining the at least one drift region and the at least two gate regions; and
a MOSFET comprising a drain node connected to the at least two first source regions, a source node connected to the at least two gate regions, and a gate node,
wherein active regions of the MOSFET are integrated in the semiconductor body in a device region that is spaced apart from the at least two gate regions.

20. The lateral transistor device of claim 19, wherein the MOSFET includes at least one transistor cell, and wherein active regions of the at least one transistor cell are integrated in the semiconductor body in a region between two of the at least two first source regions and one of the at least two gate regions.

21. The transistor device of claim 19, wherein the MOSFET comprises:
a source region and a drain region spaced apart from each other in a lateral direction of the semiconductor body;
a body region adjoining the source region; and
a gate electrode dielectrically insulated from the body region by a gate dielectric.

22. The transistor device of claim 21, wherein the gate electrode is a planar electrode arranged above a first surface of the semiconductor body.

23. The transistor device of claim 21, wherein the gate electrode is arranged in a trench extending into the semiconductor body.

24. The transistor device of claim 23, further comprising:
a layer stack with a plurality of drift regions and compensation regions, and a corresponding layer stack in the device region,
wherein the trench with the gate electrode of the MOSFET extends into at least two layers of the layer stack in the device region.

25. The transistor device of claim 24, wherein the trench extends into three or more layers of the layer stack.

* * * * *

UNITED STATES PATENT AND TRADEMARK OFFICE
CERTIFICATE OF CORRECTION

PATENT NO. : 9,825,129 B2  
APPLICATION NO. : 15/280734  
DATED : November 21, 2017  
INVENTOR(S) : A. Mauder et al.

Page 1 of 1

It is certified that error appears in the above-identified patent and that said Letters Patent is hereby corrected as shown below:

On the Title Page

Abstract (Line 12), please change "region," to -- regions, --.

In the Claims

Column 16, Line 28 (Claim 5, Line 7), please change "east" to -- least --.
Column 16, Line 54 (Claim 11, Line 3), please change "o f" to -- of --.

Signed and Sealed this
Nineteenth Day of June, 2018

Andrei Iancu
*Director of the United States Patent and Trademark Office*